United States Patent [19]
Berger

[11] Patent Number: 6,091,751
[45] Date of Patent: Jul. 18, 2000

[54] UNIPOLAR MULTIPLE-WAVELENGTH LASER

[75] Inventor: Vincent Berger, Paris, France

[73] Assignee: Thomson-CSF, Paris, France

[21] Appl. No.: 09/030,160

[22] Filed: Feb. 25, 1998

[30] Foreign Application Priority Data

Mar. 4, 1997 [FR] France ................................. 97 02545

[51] Int. Cl.⁷ ........................................................ H01S 3/19
[52] U.S. Cl. ............................... 372/45; 372/46; 372/43; 372/50
[58] Field of Search ................................. 372/43, 44, 45, 372/46, 50

[56] References Cited

U.S. PATENT DOCUMENTS

| 5,457,709 | 10/1995 | Capasso et al. | 372/45 |
| 5,509,025 | 4/1996 | Capasso et al. | 372/45 |
| 5,570,386 | 10/1996 | Capasso et al. | 372/46 |
| 5,684,817 | 11/1997 | Houdre et al. | 372/45 |
| 5,799,026 | 8/1998 | Meyer et al. | 372/45 |

FOREIGN PATENT DOCUMENTS 0 676 839 A1  10/1995  European Pat. Off. ............. 372/45 X

OTHER PUBLICATIONS

J. Faist, et al., "High Power Mid–Infrared ($\lambda$–5 $\mu$m) Quantum Cascade Lasers Operating Above Room Temperature", Appl. Phys. Lett., vol. 68, No. 26, Jun. 24, 1996, pp. 3680–3682.

C. Sirtori, et al., "Continuous Wave Operation of Midinfrared (7.4–8.6 $\mu$m) Quantum Cascade Lasers Up to 110 K Temperature", Appl. Phys. Lett., vol. 68, No. 13, Mar. 25, 1996, pp. 1745–1747.

J. Faist, et al., "Quantum Cascade Laser", Science, vol. 264, No. 5158, Apr. 22, 1994, pp. 553–556.

Patent Abstracts of Japan, vol. 12, No. 500, (E–699), Dec. 27, 1988 and JP 63 211786 A, Sep. 2, 1988.

Patent Abstracts of Japan, vol. 13, No. 543, (P–970), Dec. 6, 1989 and JP 01 224642 A, Sep. 7, 1989.

*Primary Examiner*—Brian Healy
*Attorney, Agent, or Firm*—Oblon, Spivak, McClelland, Maier & Neustadt, P.C.

[57] ABSTRACT

A unipolar multiple-wavelength quantum well laser comprises at least two stacks of layers of semiconductor materials. Each stack forms a quantum well laser working by intra-band transition and emitting a specified wavelength. The two stacks of layers are separated by a stack of layers of semiconductor materials constituting a quantum well transfer lattice which, under an electrical field, enables a transfer of electrons from the low level of the (conduction or valence) band of a quantum well of a first laser to the high level of the (conduction or valence) band of the quantum well of a second laser. FIG. 2b.

20 Claims, 5 Drawing Sheets

UNIPOLAR MULTIPLE-WAVELENGTH LASER

BACKGROUND OF THE INVENTION

The invention relates to a unipolar multiple-wavelength quantum-well laser.

In a standard semiconductor laser, the emission of photons occurs during a recombination between an electron of the conduction band and a hole of the valence band. FIG. 1 gives a schematic exemplary view of the case of a quantum well laser. In this case, the transmission wavelength is simply fixed by the energy of the transition between the two fundamental levels E1 and HH1. This energy may be modified for example by changing the width of the quantum well. However, if several quantum wells emitting at different wavelengths are placed in the cavity of a semiconductor laser, the total system will not emit laser radiation at all these different wavelengths simultaneously. Indeed there will occur an effect of competition between the different wells. Only one will prevail and the device will have emission solely at the wavelength of the "victor". This can be explained as follows: if the injection current is increased, once the laser threshold is crossed for only one of these wells, the device is in laser operation mode with stimulated emission which very soon empties these wells and therefore pumps the totality of the carriers (electrons and holes) that are injected and then lost during the radiative recombination. The Fermi level is therefore blocked and no longer increases when the current is increased. The other wells therefore cannot increase their carrier density and will not reach their laser operation threshold. These effects are well known in the literature (see appended document [1] at the end of the description).

Quantum cascade lasers (QCL) appeared in 1994 (see documents [2] and [3] at the end of the description) have a major difference with these standard lasers: the emission of a photon is done within only one band and implies only one type of carrier. This is why these QCLs may also be called "unipolar lasers". In operating in the conduction band, this type of carrier is the electron but it is possible to envisage transitions within the valence band. An operation of this kind is called intra-band operation. During operation in the conduction band, the emission involves only electrons. There is no disappearance of carriers during the emission of a photon as is the case with standard lasers. The same electron may furthermore be used several times in several quantum wells in crossing the structure, and may thus emit several photons.

The invention takes advantage of this property so that one and the same electron is used several times in several quantum wells.

SUMMARY OF THE INVENTION

The invention therefore relates to a unipolar multiple-wavelength quantum well laser comprising at least two stacks of layers of semiconductor materials, each stack forming a quantum well laser working by intra-band transition and emitting a specified wavelength, wherein the two stacks of layers are separated by a stack of layers of semiconductor materials constituting a quantum well transfer lattice which, under an electrical field, enables a transfer of electrons from the low level of the (conduction or valence) band of a first quantum well to the high level of the (conduction or valence) band of a second quantum well.

BRIEF DESCRIPTION OF THE DRAWINGS

The different objects and characteristics of the invention shall appear more clearly from the following description and the appended figures, of which.

MORE DETAILED DESCRIPTION

Figure 2A:
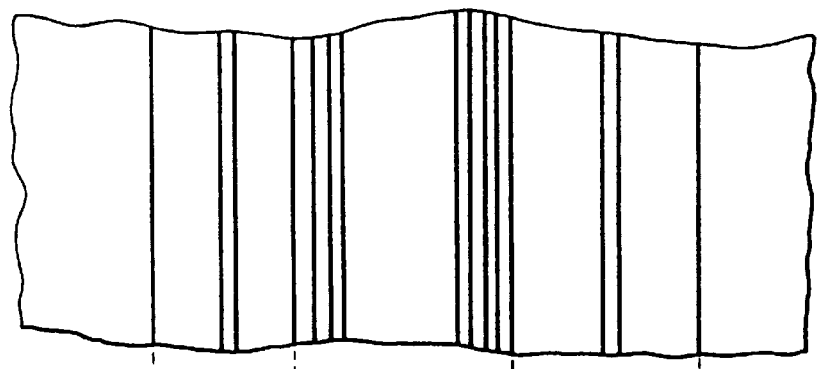
FIGS. 2a and 2b show a quantum laser well according to the invention.
Figure 2B:
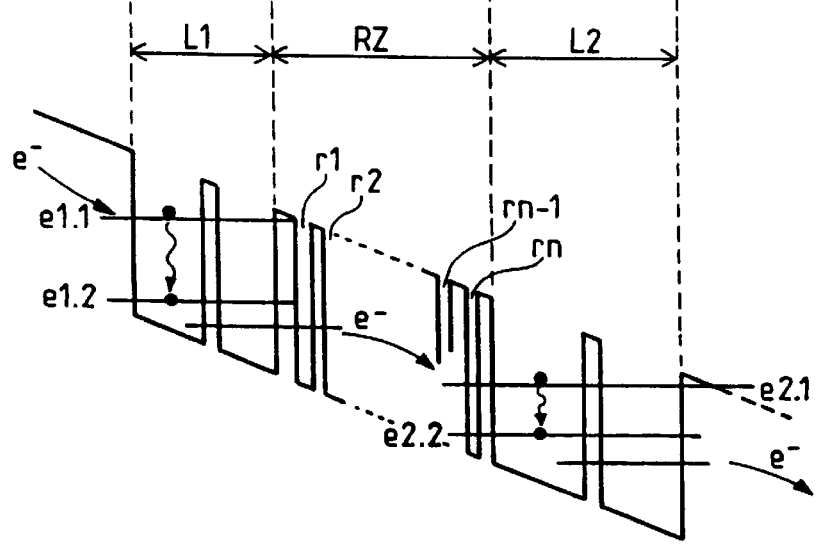

Referring to FIGS. 2a and 2b, we shall first of all provide a general description of the object of the invention.

FIG. 2a shows several stacks of layers constituting quantum wells:

the stack of layers L1 constitutes a first quantum well laser emitting at a first wavelength $\lambda_i$;

the stack of layers L2 constitutes a second quantum well laser emitting at a second wavelength $\lambda_j$;

the stack of layers RZ constitutes a coupling quantum well lattice enabling the transfer of the electrons from the laser L1 towards the laser L2 as shall be described.

FIG. 2b shows the profile of the conduction band of these different stacks of layers.

Each layer has at least two energy levels e1.1 and e1.2 for the laser L1 and e2.1 and e2.2 for the laser L2. Under electrical excitation, the conduction band profile is such that the level e1.2 is at a level higher than e2.1. The quantum well lattice RZ is designed in such a way as to conduct electrons from the quantum well of the laser L1 to the quantum well of the laser L2, passing from the level e1.2 to the level e2.1.

Figure 1:
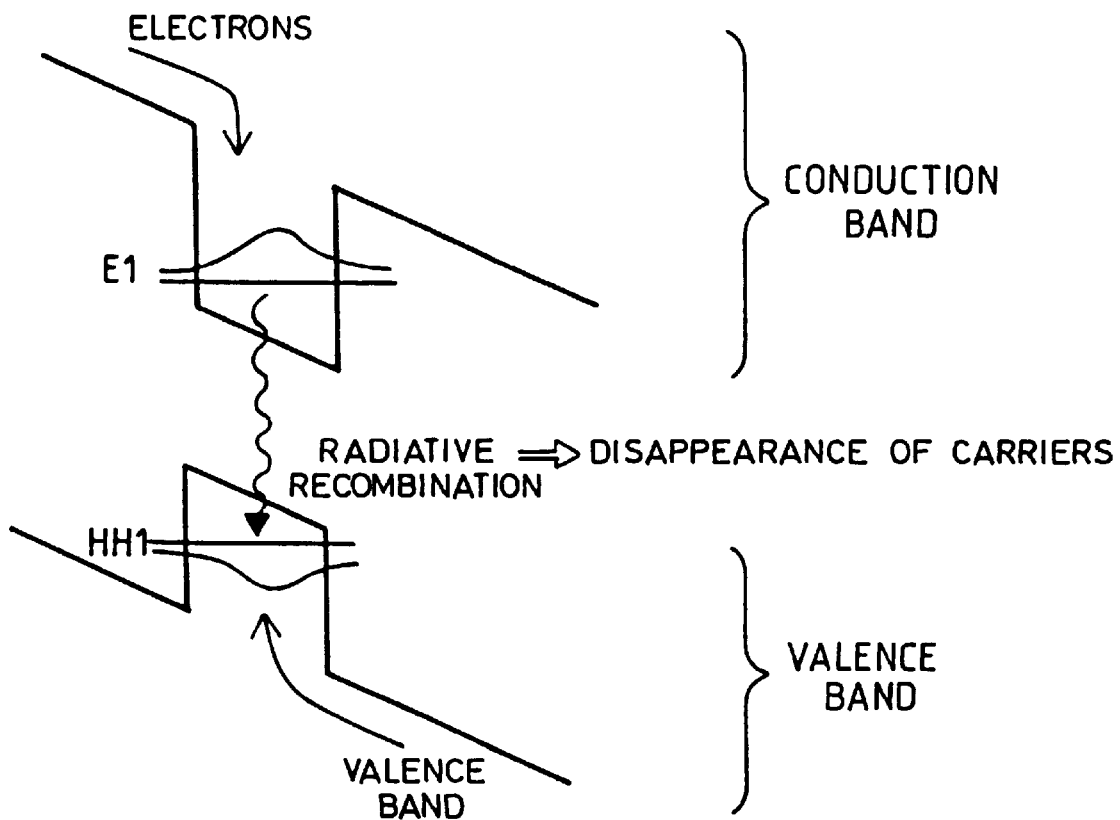
FIG. 1 gives a view of a quantum well laser working in inter-band transition mode.

To simplify the description, we have considered only two energy levels per quantum well. However, as shown in FIG. 1, page 554 of the reference [3], a second energy level may be considered.

The lattice RZ consists of a succession of quantum wells containing energy levels on which the transportation of electrons between the low energy level e1.2 of the laser L1 and the high energy level e2.1 of the laser L2 gets organized.

The detailed working of the thicknesses of layers of the lattice RZ is obtained by known techniques (by resolving Schrödinger's equation).

As shown in FIG. 2b, the first quantum well r1 of the lattice RZ contains an energy level er1 that is lower than but close to the level e1.2. The second quantum well r2 contains an energy level er2 that is lower than but close to the energy level er1 and so on and so forth until the last quantum well rn which contains an energy level ern that is slightly higher than the level e2.1. This operation is done in an electrical field. All the wells of the lattice R2 are strongly coupled. This means that the wave functions of the electrons are relatively delocalized on several wells.

It is seen therefore that, during the emission of a photon by laser L1, the electron is not lost but recovered and injected into the laser L2 to be re-emitted. Under these conditions, unlike in a standard semiconductor laser, there is no competition between the different wavelengths. The electrons are not injected and consumed in a single well but through all the quantum wells, giving rise successively to the emission of the different corresponding wavelengths.

According to the example of FIGS. 2a and 2b, the number of wavelengths that can be emitted is equal to 2, the lasers L1 and L2 emitting different wavelengths.

It is possible to provide for a greater number of lasers emitting at different wavelengths.

There is no upper limit to the number of wavelengths except the technological limit of the number of quantum wells that can be deposited on a substrate. Nor is there any spectral limit to the wavelengths that a laser of this kind can emit simultaneously except the limits of what can be achieved in the prior art with intersubband transitions (presently from 1.5 µm to 20 µm).

It is possible to use one or more structures for each wavelength: in the case of a two-color laser for example, it is worthwhile to use a large number of wells emitting on each of the two wavelengths (for example 30 wells for each wavelength) thus increasing the gain of each of the two wavelengths.

Should it be desired to have a large number of wavelengths simultaneously, a smaller number of wells will be placed on each wavelength. Thus, using a large number of accumulated wavelengths, a "white" laser source is obtained, namely a laser source that is spectrally greatly extended. A source of this kind is very useful for it preserves a high spectral width and, at the same time, the characteristics of spatial coherence of a laser, especially with very great brightness.

Figure 3:
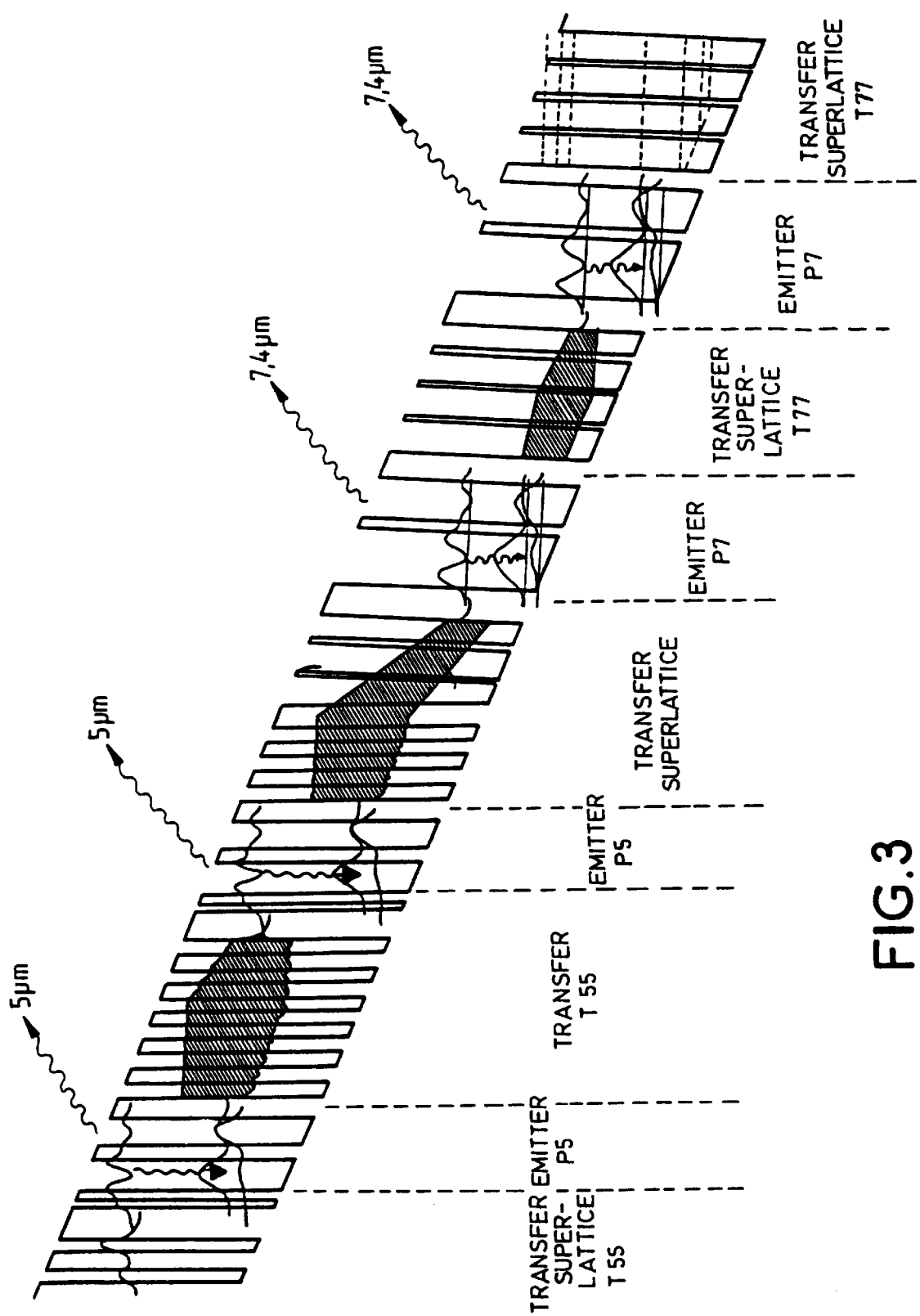
FIG. 3 gives a more detailed view of a quantum well laser according to the invention.

Referring to FIG. 3, a detailed description shall now be given of an exemplary embodiment of a two-color laser according to the invention. For example, the emission wavelengths of this bicolor laser are 5 µm and 7.4 µm.

Briefly, the structure consists of a standard waveguide in which the light is guided at 5 µm as well as at 7.4 µm. This waveguide may be obtained by depositing layers (not shown) with a smaller refraction index below and above the body of the guide using conventional techniques for the deposition of semiconductor heterostructures such as molecular beam epitaxy. The body of this waveguide contains the active region which contains the quantum wells emitting the laser rays.

In the structure of FIG. 3, there are laser emitters P5 emitting at 5 µm and laser emitters P7 emitting at 7.4 µm.

The different laser emitters are therefore series-connected by means of quantum well coupling lattices.

The type of emitter P5 emitting at 5 µm is for example of the kind described in the reference [4], formed by a sequence of semiconductor layers $Al_{0.48}In_{0.52}As/Ga_{0.47}In_{0.53}As$ whose thicknesses are designed so that the difference between the levels implicated in the intersubband transition gives a wavelength equal to 5 µm. The second type of emitter P7 emitting at 7.4 µm is similar to the structure described in the reference [5]. Between two successive emitters, i and j, the transportation is achieved in a lattice. This lattice is, in a way, a connector providing for transportation between two successive emitters. It must have the following two properties: an efficient collection of carriers on the "low" level of an emitter i so as to empty it very swiftly in order to obtain the reversal of population, and also efficient injection on the "high" level of the following emitter j. In the present example, four types of lattice are made according to the type of laser emitter (P5 or P7) present on either side of the lattice. They are referenced T55, T57, T75 or T77. Tmn designates the lattice separating a Pm type emitter from a Pn type emitter. The lattices Tmn differ by the different thicknesses of the layers that form them so as to set up a connection between the energy levels of the emitters i and j, which are of the m and n type respectively. The two types of emitters P5 and P7 may be combined in different ways: all the 5 µm emitters can be placed at the beginning of the structure followed by the 7.4 µm emitters at the end. In all, a P5/T55/P5/T55/P5/T57/P7/T77/P7/T77 type structure is obtained. One approach consists in placing the 5 µm emitters in the middle of the structure to optimize the overlapping of the two emissions with the fundamental modes of the optical waveguide. We then obtain a structure P7/T77/P7 . . . T77/P7/T75/P5/T55/P5 . . . P5/T57/P7/T77/P7 . . . T77/P7. Another approach consists in mixing the two types of emitters in changing them each time: . . . P7/T75/P5/T57/P7/T75 . . . .

T55 and T77 organize the transport between identical emitter layers. They are therefore quite similar to the transfer lattices used for simple QCL lasers with only one wavelength ([4], [5]). By contrast, T57 and T75 are original for they enable the association of the emitters with different wavelengths.

Figure 4A:
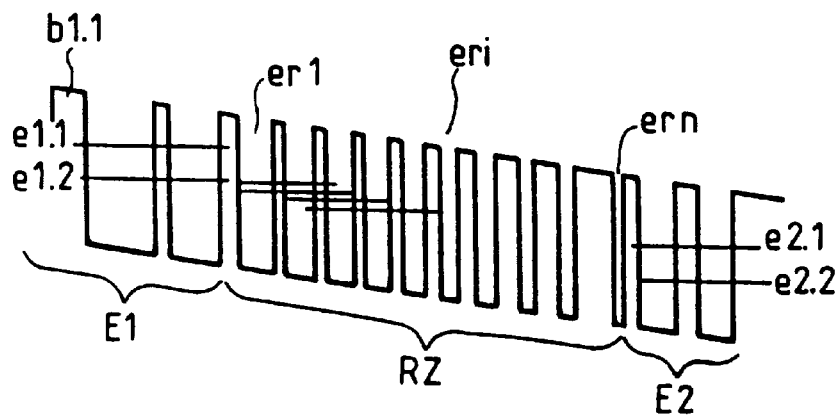
FIGS. 4a to 4d show exemplary detailed embodiments of the device of the invention.

FIG. 4a shows an exemplary embodiment of a lattice in which the energy level er1 of the first quantum well is close to the energy level e1.2. The differences between neighboring energy levels close to the lattice RZ are also narrow but may increase in going from the well er1 to an intermediate well eri and then diminish in going from the intermediate well eri to the last well of the lattice ern.

A detailed description shall now be given of exemplary embodiments in which the barrier layers are made of $Al_{0.48}In_{0.52}As$ material and the quantum well layers are made of $Ga_{0.47}In_{0.53}As$

1st EXAMPLE

Figure 4B:
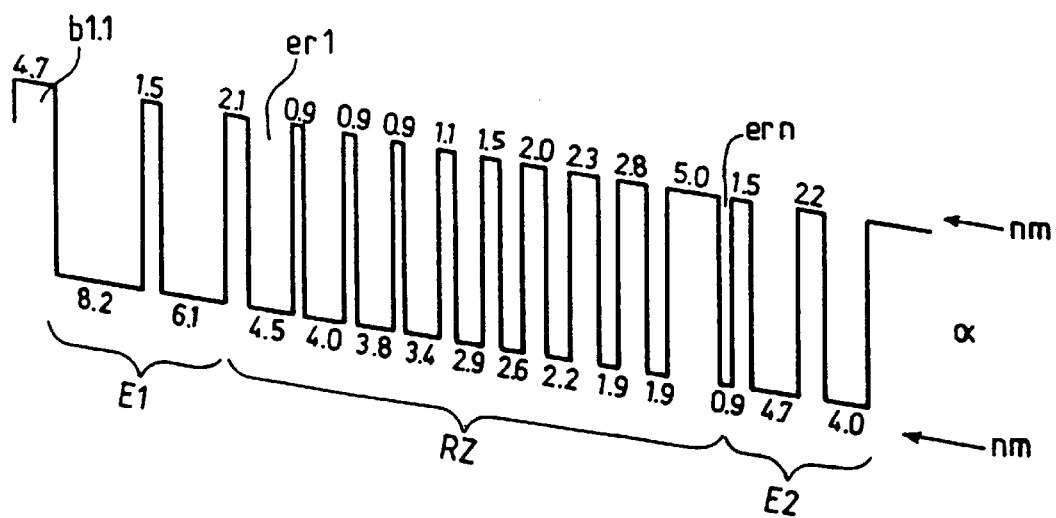

FIG. 4b shows the thicknesses (in nanometers) of the barrier layers on the upper part of the conduction band of the structure and the thicknesses (in nanometers) of the well layers on the lower part.

The emitter E1 emits at 7.4 µm and comprises a 4.7 nm barrier layer and two 8.2 nm and 6.1 nm quantum wells separated by a thin 1.5 nm barrier layer.

The emitter E2 emits at 5 µm and has a 1.5 nm barrier layer and two 4.7 nm and 4.0 nm well layers separated by a thin 2.2 nm barrier layer.

Means for the application of an electrical field (not shown) are connected on either side of the structure and apply an electrical field to it, this electrical field being oriented from the emitter E1 to the emitter E2.

The transfer lattice consists of a stack of barrier layers and well layers. The thicknesses of the barrier layers increase from the emitter E1 to the emitter E2 between 0.9 nm and 5 nm. The thicknesses of the quantum well layers diminish from 4.5 nm to 0.9 nm. A lattice of this kind corresponds to the lattice T75 of the previous description.

2nd EXAMPLE

Figure 4C:
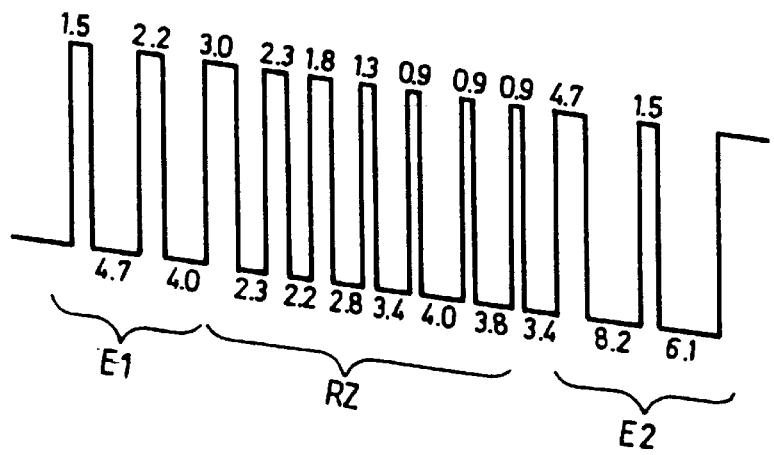

The second example shown in FIG. 4c is aimed at describing a lattice T57 of the above description.

The emitter E1 emits at 5 µm. It has a 1.5 nm barrier layer and two 4.7 nm and 4.0 nm well layers separated by a thin barrier layer of 2.2 nm.

The emitter E2 emits at 7.4 µm. It has a 4.7 nm barrier layer and two 8.2 nm and 6.1 nm well layers separated by a thin barrier layer of 1.5 nm.

Means for the application of an electrical field (not shown) are connected to either side of the structure and apply an electrical field to the structure oriented from the emitter E1 to the emitter E2.

The transfer lattice RZ comprises a succession of wells for which the thicknesses of the barrier layers diminish from 3 nm to 0.9 nm in going from the emitter E1 to the emitter E2 while the well layer thicknesses increase from 2.3 nm to 3.4 nm.

3rd EXAMPLE

Figure 4D:
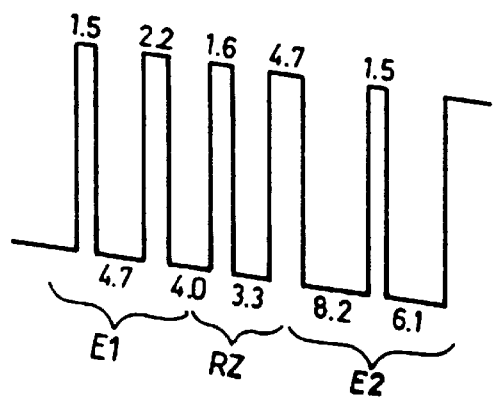

FIG. 4d shows an emitter E1 emitting at 5 μm coupled to an emitter E2 at 7.4 μm. The transfer lattice RZ has a 3.3 nm well layer sandwiched between two 1.6 nm and 4.7 nm barrier layers.

A multicolored source according to the invention can find application by replacing a black body in all spectroscopic applications. For, the black body has a good spectral range but very poor brightness, less than that of a laser by several magnitudes. It is possible for example to provide a Fourier transform interferometer with a white infrared laser having a signal-to-noise ratio that is far better and can be used for the spectroscopy of extremely small objects (with a size of some microns). This is absolutely not possible with present-day interferometers.

In certain very precise cases, it is possible to provide for the transfer of the electrons from a first laser emitting at a first wavelength to a second laser emitting at a second wavelength by appropriately sizing the thickness of the barrier laser between them. This is the case for example with the following structure:

The first laser has two layers of wells with thicknesses of 4.7 μm and 4.0 μm separated by a barrier of 2.2 μm, the entire unit being held between two barrier layers of 1.5 μm and 4.7 μm. This laser emits at a wavelength of 5 μm.

The second laser has two layers of wells with thicknesses of 8.2 μm and 6.1 μm separated by a barrier layer of 1.5 μm. The entire unit is held between the barrier layer with a thickness of 4.5 μm of the first laser and a barrier layer with a thickness of 6.1 μm. This second laser emits at a wavelength of 7.4 μm.

Figure 5:
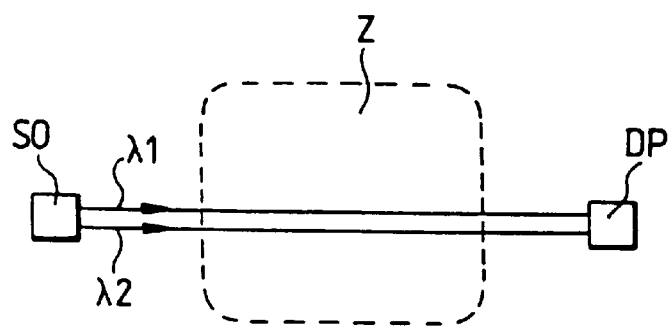
FIG. 5 shows a system of analysis applying the device of the invention.

The invention can be applied to a system of analysis such as the one shown in FIG. 5.

The system of analysis has an optical source S0, an illumination zone Z in which the medium to be observed will be placed and a photodetection device DP receiving light from the source S0 after crossing the zone Z.

According to the invention, the source S0 emits two wavelengths $\lambda_1$, $\lambda_2$. One of the wavelengths $\lambda_1$ for example is such that the medium to be observed is transparent to this wavelength $\lambda_1$. The photodetection device is provided with means for the separate measurement of the light intensity corresponding to each wavelength. In this way, since the medium to be observed is transparent at the wavelength $\lambda_1$, the light at $\lambda_1$ will act as a reference level to measure the light intensity at $\lambda_2$ and hence the absorption of light at $\lambda_2$ by the medium.

The photodetection device may for example be provided with two switching photodetectors of which one is sensitive at $\lambda_1$ and the other at $\lambda_2$. Or else only one wideband photodetector is provided and it is provided that there will be switching filters at $\lambda_1$ and $\lambda_2$ between the zone Z and the photodetector device.

References:

(1) N. W. Carlson, Monolithic Diode-Laser Arrays, Springer Verlag (1994).

(2) F. Capasso, A. Y. Cho, Y. Faist, A. L. Hutchinson, S. Luryi, C. Sirtori, D. L. Sivco, Unipolar Semiconductor Laser, European patent application (application number 95302112.8).

(3) J. Faist, F. Capasso, D. L. Sivco, C. Sirtori, A. L. Hutchinson, A. Y. Cho, Quantum Cascade Laser, Science, Vol. 265, p. 553.

(4) J. Faist, F. Capasso, C. Sirtori, D. L. Sivco, J. N. Baillargeon, A. L. Hutchinson, S. N. G. Chu and A. Y. Cho, High Power Mid-Infrared ($\lambda \approx 5$ μm) Quantum Cascade Operating Above Room Temperature, Appl. Phys. Lett., Vol. 68, p. 3680.

(5) C. Sirtori, J. Faist, F. Capasso, D L. Suro, A. L. Hutchinson, S. N. George Chu, A. Y. Cho, "Continuous Wave Operation of Mid-Infrared (7.4–8.6 μm) Quantum Cascade lasers Up To 110 K Temperature", Appl. Phys. Lett. 68, p. 1745.

What is claimed is:

1. A unipolar multiple-wavelength quantum well laser, comprising:

a first emitter comprising a quantum well with at least two energy levels configured so that the first emitter lases at a first wavelength;

a second emitter comprising a quantum well with at least two energy levels configured so that the second emitter lases at a second wavelength different from said first wavelength; and a transfer lattice positioned between said first and second emitters and having a stack of layers forming at least one quantum well, said transfer lattice being configured to transfer carriers under an electric field from a lower energy level of said first emitter to a higher energy level of said second emitter.

2. The laser of claim 1, wherein:

said transfer lattice comprises a plurality of quantum wells having energy levels diminishing from a first quantum well, positioned next to said first emitter, to a last quantum well, positioned next to said second emitter; and said first quantum well of said transfer lattice has an energy level slightly lower than said lower energy level of said first emitter.

3. The laser of claim 2, wherein said last quantum well of said transfer lattice has an energy level slightly higher than said higher energy level of said second emitter.

4. The laser of claim 2, wherein a difference in energy levels between neighboring quantum wells of said transfer lattice increases from said first quantum well of said transfer lattice to an intermediate quantum well of said transfer lattice and increases from said intermediate quantum well to said last quantum well of said transfer lattice.

5. The laser of claim 4, further comprising:

more than two emitters, each having at least one quantum well configured so that each emitter lases at a particular wavelength; and a plurality of transfer lattices, each transfer lattice separating two neighboring emitters.

6. The laser of claim 5, wherein:

a first group of emitters lases at said first wavelength and a second group of emitters lases at said second wavelength, each transfer lattice of a first group of substantially identical transfer lattices is configured to transfer carriers from an emitter belonging to one of said first and second groups of emitters to an emitter belonging to the same group of emitters, each transfer lattice of a second group of substantially identical transfer lattices is configured to transfer carriers from an emitter belonging to one of said first and second groups of emitters to an emitter belonging to the other group of emitters.

7. The laser of claim 2, wherein:

said first wavelength is higher than said second wavelength;

well barrier layers, forming said plurality of quantum wells in said transfer lattice, have a thickness increasing from said first quantum well of said transfer lattice to said last quantum well of said transfer lattice; and well layers, forming said plurality of quantum wells in said transfer lattice, have a thickness decreasing from said first quantum well of said transfer lattice to said last quantum well of said transfer lattice.

8. The laser of claim 2, wherein:

said first wavelength is lower than said second wavelength;

well barrier layers, forming said plurality of quantum wells in said transfer lattice, have a thickness decreasing from said first quantum well of said transfer lattice to said last quantum well of said transfer lattice; and well layers, forming said plurality of quantum wells in said transfer lattice, have a thickness increasing from said first quantum well of said transfer lattice to said last quantum well of said transfer lattice.

9. The laser of claim 5, wherein each of said emitters lases at a wavelength different from all other emitters.

10. A system of analysis, comprising:

a light source configured to transmit a light beam through an observation zone;

a detection device configured to detect said light beam after said light beam crossed said observation zone, wherein said light source comprises a unipolar multiple-wavelength quantum well laser comprising:
  a first emitter comprising a quantum well with at least two energy levels configured so that the first emitter lases at a first wavelength;
  a second emitter comprising a quantum well with at least two energy levels configured so that the second emitter lases at a second wavelength different from said first wavelength; and
  a transfer lattice positioned between said first and second emitters and having a stack of layers forming at least one quantum well, said transfer lattice being configured to transfer carriers under an electric field from a lower energy level of said first emitter to a higher energy level of said second emitter.

11. The system of claim 10, wherein said detection device comprises:

a first photodetector sensitive to said first wavelength; and a second photodetector sensitive to said second wavelength.

12. The system of claim 10, wherein said detection device comprises:

a wideband photodetector; and switching filters at said first wavelength and at said second wavelength.

13. The system of claim 10, wherein said transfer lattice comprises a plurality of quantum wells having energy levels diminishing from a first quantum well, positioned next to said first emitter, to a last quantum well, positioned next to said second emitter; and said first quantum well of said transfer lattice has an energy level slightly lower than said lower energy level of said first emitter.

14. The system of claim 13, wherein said last quantum well of said transfer lattice has an energy level slightly higher than said higher energy level of said second emitter.

15. The system of claim 13, wherein a difference in energy levels between neighboring quantum wells of said transfer lattice increases from said first quantum well of said transfer lattice to an intermediate quantum well of said transfer lattice and increases from said intermediate quantum well to said last quantum well of said transfer lattice.

16. The system of claim 15, further comprising:

more than two emitters, each having at least one quantum well configured so that each emitter lases at a particular wavelength; and a plurality of transfer lattices, each transfer lattice separating two neighboring emitters.

17. The system of claim 16, wherein:

a first group of emitters lases at said first wavelength and a second group of emitters lases at said second wavelength, each transfer lattice of a first group of substantially identical transfer lattices is configured to transfer carriers from an emitter belonging to one of said first and second groups of emitters to an emitter belonging to the same group of emitters, each transfer lattice of a second group of substantially identical transfer lattices is configured to transfer carriers from an emitter belonging to one of said first and second groups of emitters to an emitter belonging to the other group of emitters.

18. The system of claim 13, wherein:

said first wavelength is higher than said second wavelength;

well barrier layers, forming said plurality of quantum wells in said transfer lattice, have a thickness increasing from said first quantum well of said transfer lattice to said last quantum well of said transfer lattice; and well layers, forming said plurality of quantum wells in said transfer lattice, have a thickness decreasing from said first quantum well of said transfer lattice to said last quantum well of said transfer lattice.

19. The system of claim 13, wherein:

said first wavelength is lower than said second wavelength;

well barrier layers, forming said plurality of quantum wells in said transfer lattice, have a thickness decreasing from said first quantum well of said transfer lattice to said last quantum well of said transfer lattice; and well layers, forming said plurality of quantum wells in said transfer lattice, have a thickness increasing from said first quantum well of said transfer lattice to said last quantum well of said transfer lattice.

20. The system of claim 16, each of said emitters lases at a wavelength different from all other emitters.

* * * * *